US007167406B2

(12) United States Patent
Komiya

(10) Patent No.: US 7,167,406 B2
(45) Date of Patent: Jan. 23, 2007

(54) IMAGE DISPLAY DEVICE AND DRIVING METHOD THEREOF

(75) Inventor: Naoaki Komiya, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 179 days.

(21) Appl. No.: 10/984,083

(22) Filed: Nov. 8, 2004

(65) Prior Publication Data

US 2005/0104820 A1 May 19, 2005

(30) Foreign Application Priority Data

Nov. 10, 2003 (KR) ...................... 10-2003-0079091

(51) Int. Cl.
*G11C 7/00* (2006.01)
*G09G 3/32* (2006.01)

(52) U.S. Cl. ........................................ 365/203; 345/82

(58) Field of Classification Search ................ 365/203, 365/215; 345/82, 212
See application file for complete search history.

(56) References Cited

U.S. PATENT DOCUMENTS 6,836,269 B1 * 12/2004 Maeda et al. ............... 345/212
6,995,737 B1 * 2/2006 LeChevalier ................. 345/82
7,057,589 B1 * 6/2006 Shin et al. ..................... 345/82

FOREIGN PATENT DOCUMENTS

| | | |
|---|---|---|
| JP | 7-13512 | 1/1995 |
| KR | 10-0539529 | 12/2005 |

OTHER PUBLICATIONS

Patent Abstracts of Japan for Publication No. 07-013512; Date of publication of application Jan. 17, 1995, in the name of Yoichi Kobori.

Korean Patent Abstracts for Publication No. 10-0539529; Date of publication of application Dec. 22, 2005, in the name of Hak Su Kim and Min Ho Lee.

* cited by examiner

*Primary Examiner*—Anh Phung
(74) *Attorney, Agent, or Firm*—Christie, Parker & Hale LLP

(57) ABSTRACT

An image display device including a plurality of data lines for transmitting data currents which correspond to images and a plurality of scan lines for transmitting select signals. A plurality of pixel circuits coupled to the data lines and the scan lines are used to display the images which correspond to the data currents in response to the select signals. A precharge driver applies a precharge voltage to at least one of the data lines. The precharge driver varies the precharge voltage in correspondence to at least one of the data currents.

20 Claims, 11 Drawing Sheets

IMAGE DISPLAY DEVICE AND DRIVING METHOD THEREOF

CROSS REFERENCE TO RELATED APPLICATION

This application claims priority to and the benefit of Korea Patent Application No. 10-2003-0079091 filed on Nov. 10, 2003 in the Korean Intellectual Property Office, the entire content of which is incorporated herein by reference.

BACKGROUND OF THE INVENTION (a) Field of the Invention

The present invention relates to an image display device and a driving method thereof. More specifically, the present invention relates to an organic EL (electroluminescent) display driving method.

(b) Description of the Related Art

In general, an organic EL display electrically excites a phosphorous organic compound to emit light, and it voltage- or current-drives N×M organic emitting cells to display images. As shown in FIG. 1, the organic emitting cell includes an anode (e.g., indium tin oxide (ITO)), an organic thin film, and a cathode layer (metal). The organic thin film has a multi-layer structure including an emitting layer (EML), an electron transport layer (ETL), and a hole transport layer (HTL) for maintaining balance between electrons and holes and improving emitting efficiencies. Further, the organic emitting cell includes an electron injecting layer (EIL) and a hole injecting layer (HIL).

Methods for driving the organic emitting cells include a passive matrix method, and an active matrix method using thin film transistors (TFTs). In the passive matrix method, cathodes and anodes are arranged perpendicular to each other to selectively drive the lines. On the other hand, in the active matrix method, a TFT is coupled to each ITO pixel electrode to thereby maintain the voltage by capacitance of a capacitor. The active matrix method is classified as a voltage programming method or a current programming method according to signal forms supplied for programming a voltage in the capacitor.

It is difficult for the conventional voltage-programming pixel circuit to obtain high gray scales because of a threshold voltage $V_{TH}$ of a TFT and deviation of mobility of carriers caused by non-uniformity of a manufacturing process. For example, when a TFT is driven by a voltage of 3V (volts), the voltage is applied to a gate of the TFT at intervals of less than 12 mV (=3V/256) in order to represent 8-bit (256) gray scales. Therefore, for example, if the deviation of the threshold voltage of the TFT is 100 mV because of the non-uniformity of a manufacturing process, it becomes difficult to represent the high gray scales.

The current programming type pixel circuit produces substantially uniform display characteristics even if the driving transistor of each pixel has non-uniform voltage-current characteristics, when a current source for supplying the current to the pixel circuit is substantially uniform over the total panel.

FIG. 2 shows a conventional current programming type pixel circuit.

As shown in FIG. 2, the conventional current programming type pixel circuit includes transistors M1, M2, M3, M4 and a capacitor C1.

A source of the transistor M1 is coupled to a power source VDD, and the capacitor C1 is coupled between the source and a gate of the transistor M1. The transistor M2 is coupled between the transistor M1 and an organic EL element OLED, and transmits the current flowing through the transistor M1 to the organic EL element OLED in response to a second select signal applied to a scan line En.

The transistor M3 is coupled between a data line Dm and the gate of the transistor M1, and transmits a data current to the gate of the transistor M1 in response to a first select signal applied to a scan line Sn. In this instance, the data current is transmitted to the gate of the transistor M1 until the current having substantially the same magnitude as that of the data current flows to a drain of the transistor M1.

The transistor M4 transmits the data current to the drain of the transistor M1 in response to the first select signal applied to the scan line Sn.

By the above-noted configuration, a current which has substantially the same magnitude as that of the data current flows to the organic EL element OLED, and the OLED emits light in response to the data current.

A benefit of the conventional current programming type pixel circuit is that the current which flows to the OLED has a substantially uniform characteristic over the whole panel, compared to the voltage programming type pixel circuit, but has a problem of a long data programming time.

As shown in FIG. 3, the data programming time in the current programming type pixel circuit is influenced by the level of a voltage stored in the parasitic capacitance of the data line by the data current of a previous pixel line, and in particular, the data programming time is increased when the difference between the voltage levels of the data line and a target voltage (a voltage which corresponds to the current data) is large. This phenomenon becomes more noticeable when the gray level is low (e.g., near the black level) since voltage at the data line needs to be modified using a small amount of current.

SUMMARY OF THE INVENTION

In an exemplary embodiment of the present invention, a driving method for reducing a data programming time in a current programming type pixel circuit, is provided.

In another exemplary embodiment of the present invention, a driving method for accurately precharging data lines on a display panel of an image display device, is provided.

In one aspect of the present invention, an image display device includes a plurality of data lines for transmitting data currents which correspond to images and a plurality of scan lines for transmitting select signals. A plurality of pixel circuits are coupled to the data lines and the scan lines, and are used for displaying the images which correspond to the data currents in response to the select signals. A precharge driver applies a precharge voltage to at least one of the data lines, wherein the precharge driver varies the precharge voltage in correspondence to at least one of the data currents.

The precharge driver may apply the precharge voltage to the at least one of the data lines before the at least one of the data currents is applied to the at least one of the data lines.

The precharge driver may apply the precharge voltage to one of the data lines coupled to a corresponding one of the pixel circuits before one of the select signals is applied to one of the scan lines coupled to the corresponding one of the pixel circuits after another one of the select signals is applied to a previous one of the scan lines.

At least one of the pixel circuits may include a display element for displaying the images corresponding to an amount of a current which is applied thereto, and a driving transistor may include a first electrode, a second electrode, and a third electrode. The driving transistor may control the current which flows to the third electrode from the second electrode according to a voltage difference between the first electrode and the second electrode. A first switch may transmit a corresponding one of the data currents applied to a corresponding one of the data lines to the first electrode of the driving transistor in response to a corresponding one of the select signals. A second switch may diode-connect the driving transistor in response to the corresponding one of the select signals. A capacitor, coupled between the first and second electrodes of the driving transistor, may store a voltage corresponding to the corresponding one of the data currents.

The driving transistor may be a P-type transistor, and the precharge voltage may be inversely proportional to a magnitude of the corresponding one of the data currents.

The driving transistor may be an N-type transistor, and the precharge voltage may be proportional to a magnitude of the corresponding one of the data currents.

The precharge driver may include a precharge voltage source, and a switch coupled between the precharge voltage source and a corresponding one of the data lines.

The precharge voltage source may include a shift register for sequentially shifting data which correspond to the images, a latch for storing the data transmitted by the shift register, and a D/A (digital/analog) converter for converting the data stored in the latch into analog voltages that are provided as the precharge voltage.

In another aspect of the present invention, an image display device includes a plurality of scan lines and a plurality of data lines, and a plurality of pixel circuits, coupled to the scan lines and the data lines, for displaying images according to data currents applied to the data lines in response to select signals applied to the scan lines. The image display device includes a data driver for applying the data currents corresponding to the images to the data lines, a scan driver for supplying the select signals to the scan lines, and a precharge driver for applying the precharge voltage corresponding to image signals for the images to the data lines.

In still another aspect of the present invention, a driving method of an image display device including a plurality of data lines for transmitting data currents corresponding to images, a plurality of scan lines for transmitting select signals, and a plurality of pixel circuits coupled to the data lines and the scan lines, is provided. A precharge voltage is applied to one of the data lines during a first period, and one of the data currents provided by the one of the data lines is transmitted to a corresponding one of the pixel circuits in response to one of the select signals provided by a corresponding one of the scan lines during a second period. The precharge voltage has different levels with respect to at least two of the data lines for applying different said data currents.

In still another aspect of the present invention, an image display device includes a plurality of data lines for transmitting data currents which correspond to images, a plurality of first scan lines for transmitting first select signals, and a plurality of second scan lines for transmitting second select signals. A plurality of pixel circuits, each said pixel circuit being coupled to a corresponding said data line, a corresponding said first scan line and a corresponding said second scan line, are used to display images which correspond to the data currents in response to the first and second select signals. A precharge driver applies a precharge voltage to the data lines, wherein the precharge driver varies the precharge voltage in correspondence to the data currents.

BRIEF DESCRIPTION OF THE DRAWINGS

The accompanying drawings, together with the specification, illustrate exemplary embodiments of the present invention, and, together with the description, serve to explain the principles of the present invention.

DETAILED-DESCRIPTION

In the following detailed description, only certain exemplary embodiments of the present invention are shown and described, simply by way of illustration. As those skilled in the art would realize, the present invention may be modified in various different ways, all without departing from the spirit or scope of the present invention. Accordingly, the drawings and description are to be regarded as illustrative in nature, and not restrictive.

Figure 4:
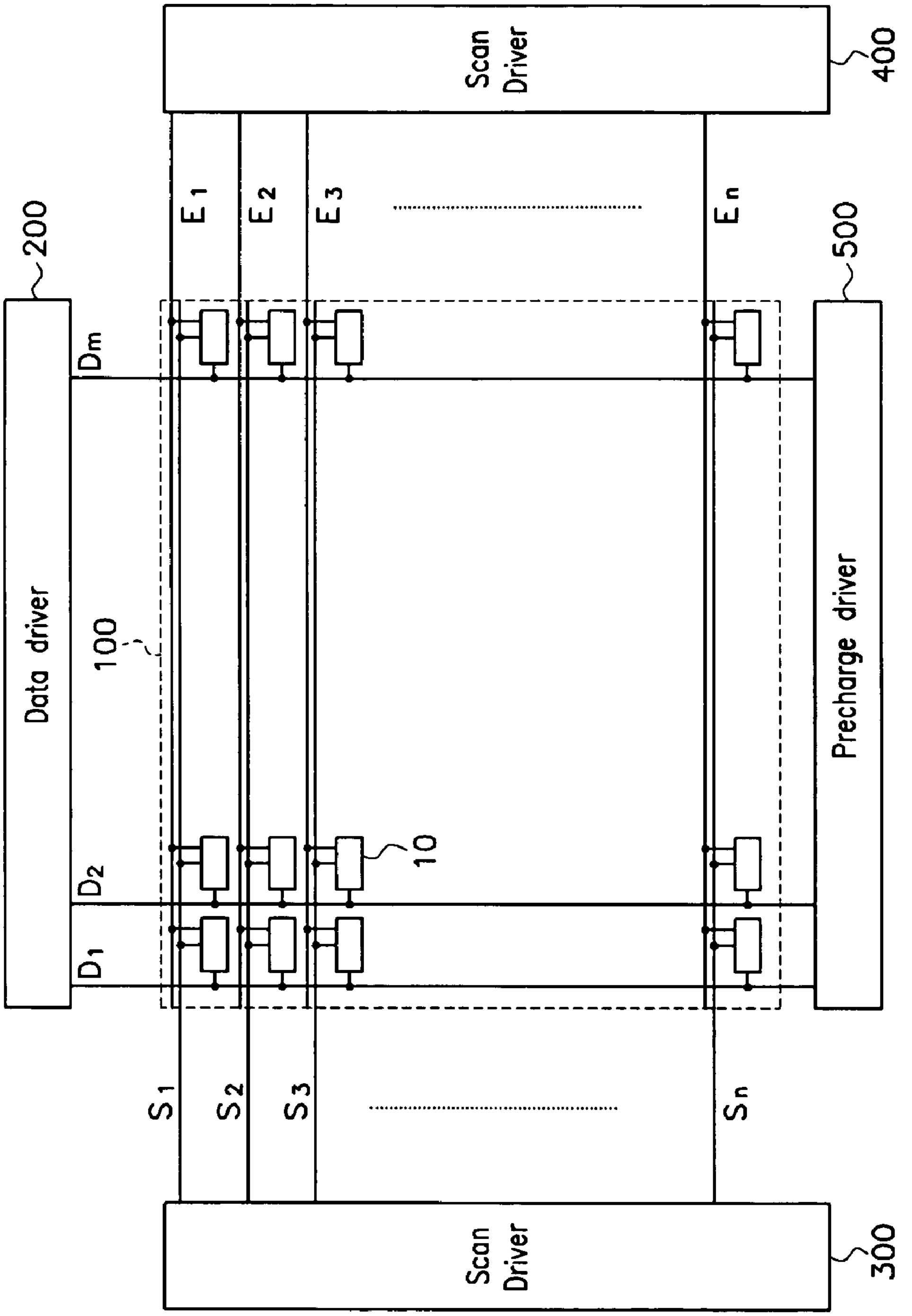
FIG. 4 shows a brief schematic diagram of an image display device according to an exemplary embodiment of the present invention.

As shown in FIG. 4, the image display device includes an organic EL display panel (referred to as a display panel hereinafter) 100, a data driver 200, scan drivers 300 and 400, and a precharge driver 500.

The display panel 100 includes a plurality of data lines D1 to Dm arranged in the column direction, a plurality of scan lines S1 to Sn and E1 to En arranged in the row direction, and a plurality of pixel circuits 10. The data lines D1 to Dm transmit the data currents corresponding to image signals for images to the pixel circuits 10, the scan lines S1 to Sn transmit select signals to the pixel circuits 10, and the scan lines E1 to En transmit emit signals to the pixel circuits 10. Each of the pixel circuits 10 is formed at a corresponding pixel region defined by two adjacent data lines and two adjacent scan lines.

The data driver 200 applies data currents to the data lines D1 to Dm, and the scan drivers 300 and 400 sequentially apply select signals and emit signals to the scan lines S1 to Sn and E1 to En, respectively.

The precharge driver 500 applies a precharge voltage to the data lines D1 to Dm before the data current is applied thereto, and modifies the precharge voltage according to the data current.

The data driver 200, the scan drivers 300 and 400, and/or the precharge driver 500 may be coupled to the display panel 100, may be installed as a chip in a TCP (tape carrier package) attached and coupled to the display panel 100, or may be installed as a chip on an FPC (flexible printed circuit) or a film attached and coupled to the display panel 100. Alternatively, they may be directly installed on a glass substrate of the display panel, and may be substituted with a driving circuit on the same layer as that of signal lines, data lines, and TFTs.

Figure 1:
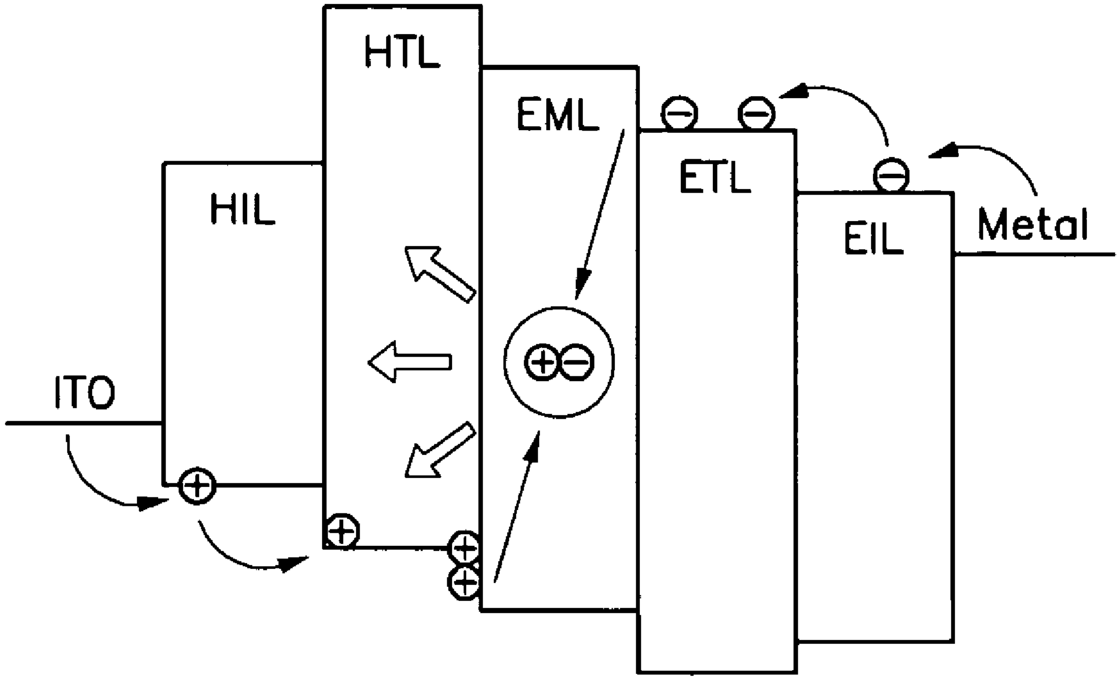
FIG.1 Prior art
FIG. 1 shows a conceptual diagram of an organic EL element.
Figure 2:
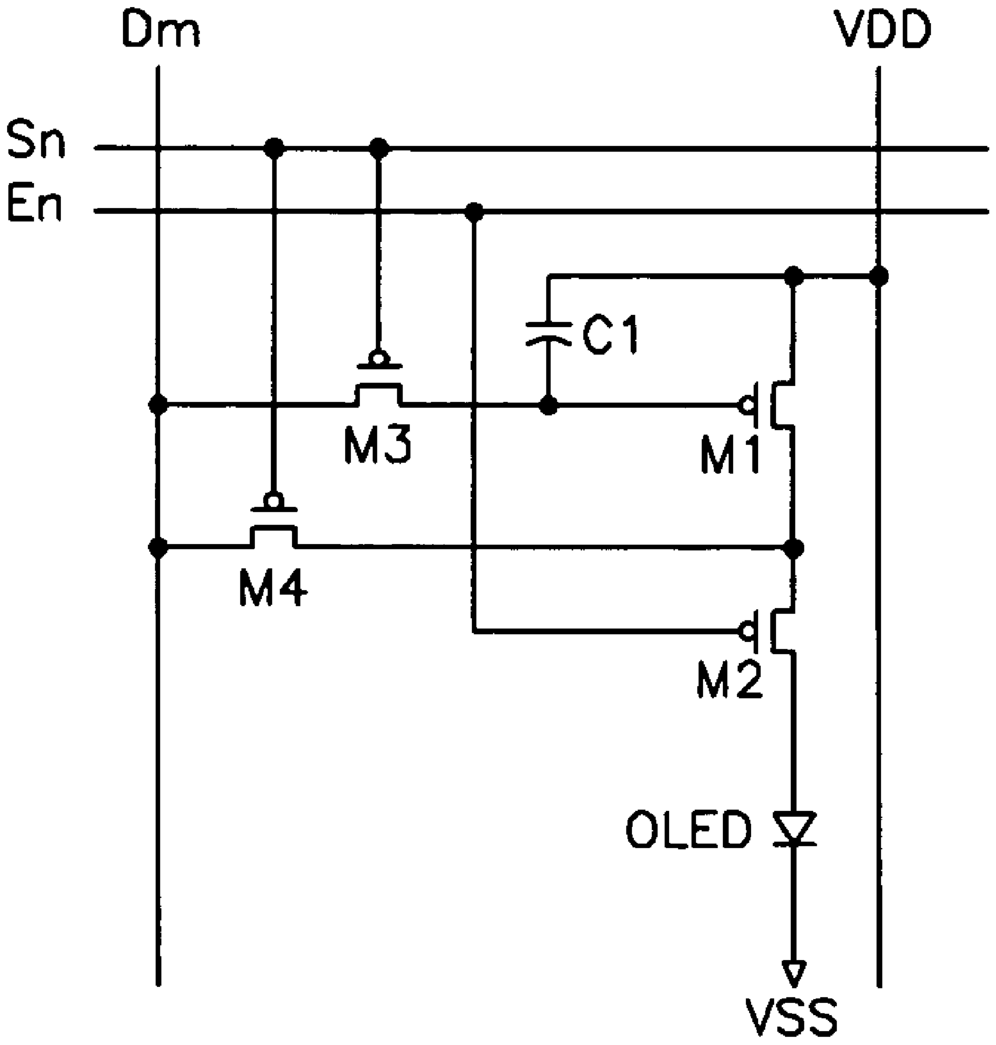
FIG.2 Prior art
FIG. 2 shows a conventional current programming type pixel circuit.
Figure 3:
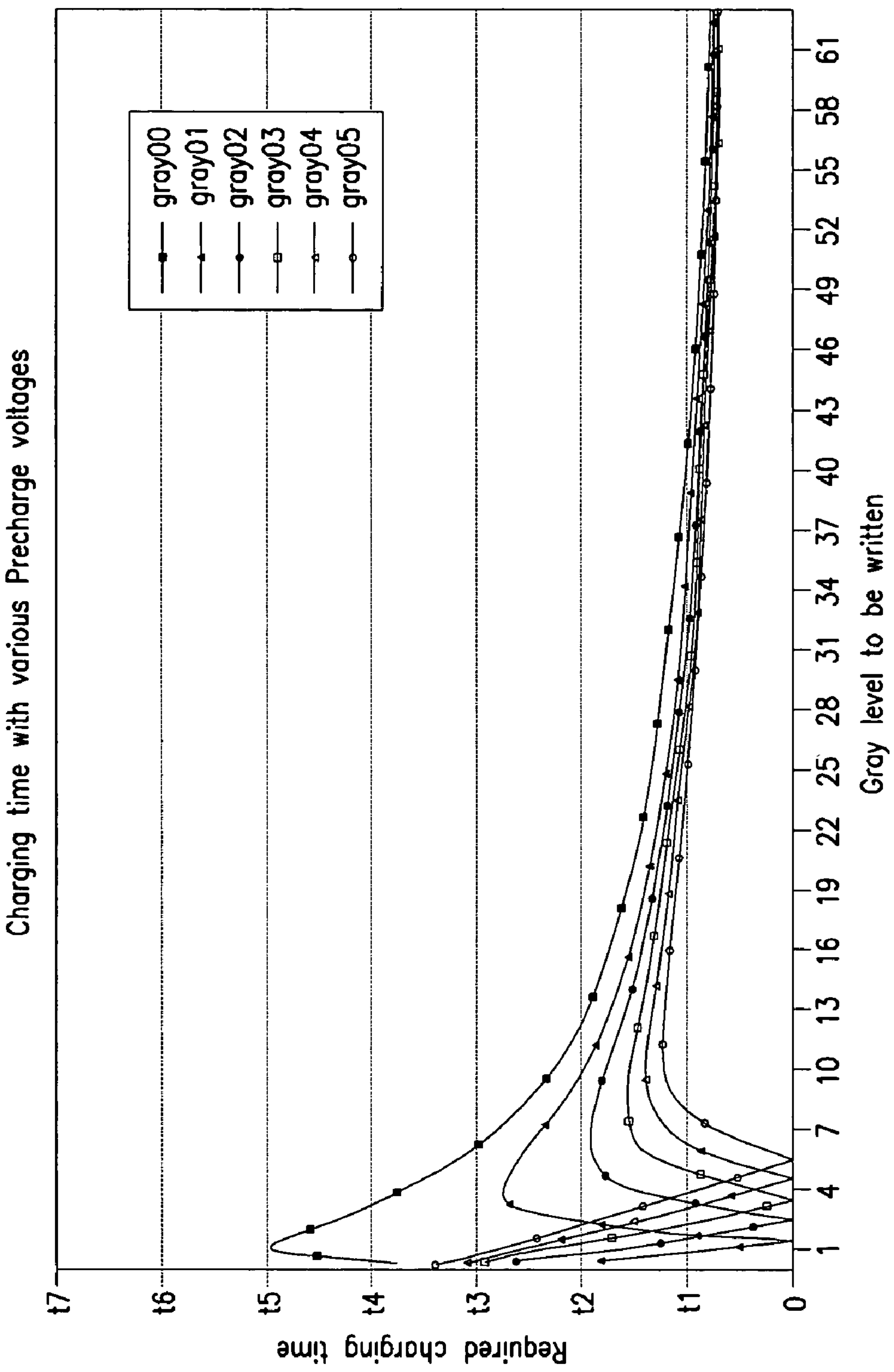
FIG.3 Prior art
FIG. 3 shows variations of data programming times per gray level with respect to data programmed to a pixel coupled to a previous scan line in an image display device.
Figure 5A:
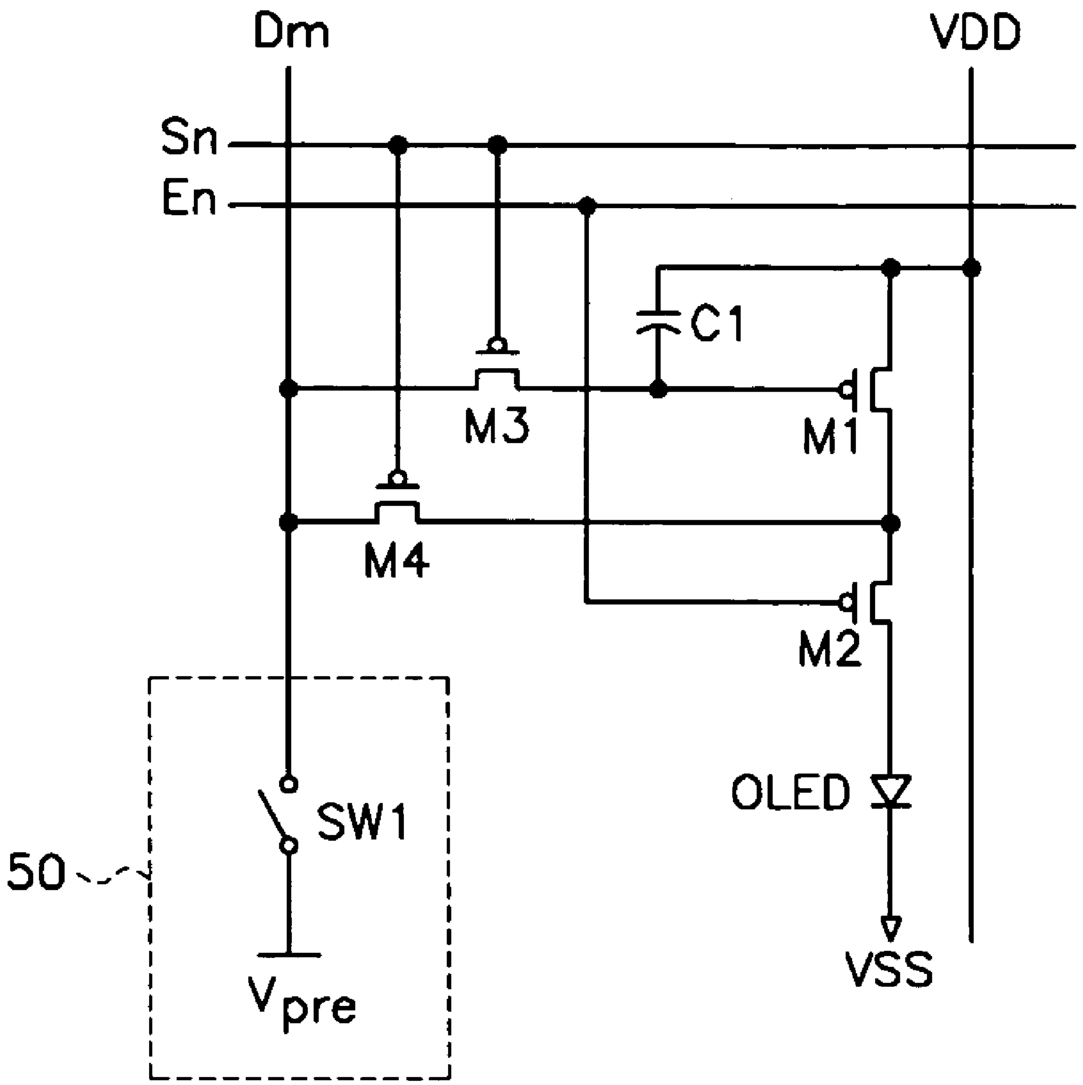
FIG. 5A shows an exemplified case of applying a precharge voltage according to an exemplary embodiment of the present invention to the pixel circuit of FIG. 2.
Figure 6A:
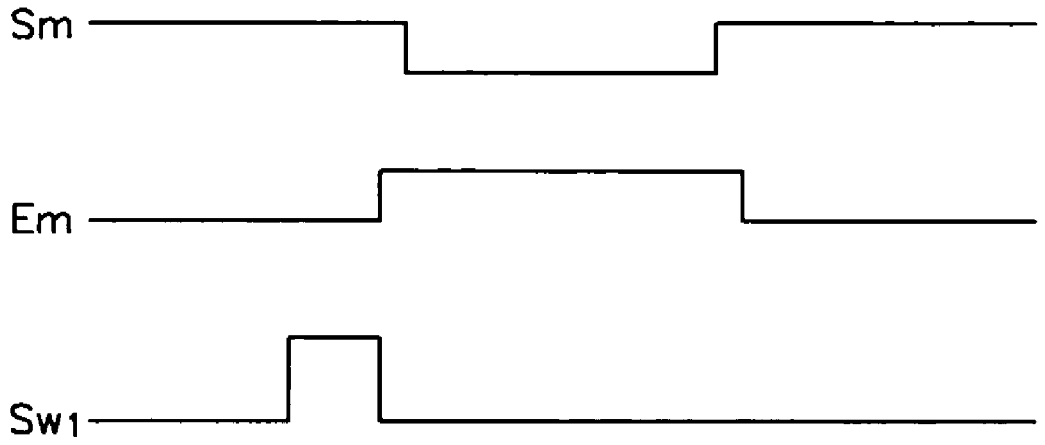
FIG. 6A shows a driving waveform diagram for driving the pixel circuit of FIG. 5A.

FIG. 5A shows a pixel circuit according to an exemplary embodiment of the present invention in which a precharge voltage is applied to the pixel circuit of FIG. 2, and FIG. 6A shows a driving waveform diagram for driving the pixel circuit of FIG. 5A. The pixel circuit of FIG. 5A, for example, may be used in the image display device of FIG. 4. For ease of description, a pixel circuit coupled to the $m^{th}$ data line Dm and the $n^{th}$ scan lines Sn and En, and a precharge driver 50 coupled to the $m^{th}$ data line Dm are illustrated in FIG. 5A. Also, a switch SW1 is assumed to be turned on when an applied control signal has high level.

Referring to FIGS. 5A and 6A, a driving method according to the exemplary embodiment of the present invention will be described. Since FIG. 5A shows the case of applying the concept of the exemplary embodiment of the present invention to the conventional representative pixel circuit, and the pixel circuit of FIG. 5A substantially corresponds to the pixel circuit of FIG. 2, no detailed description of the pixel circuit will be provided.

A precharge operation for reducing the data programming time is performed before a data programming operation for supplying the data current to the data line is performed.

Figure 7A:
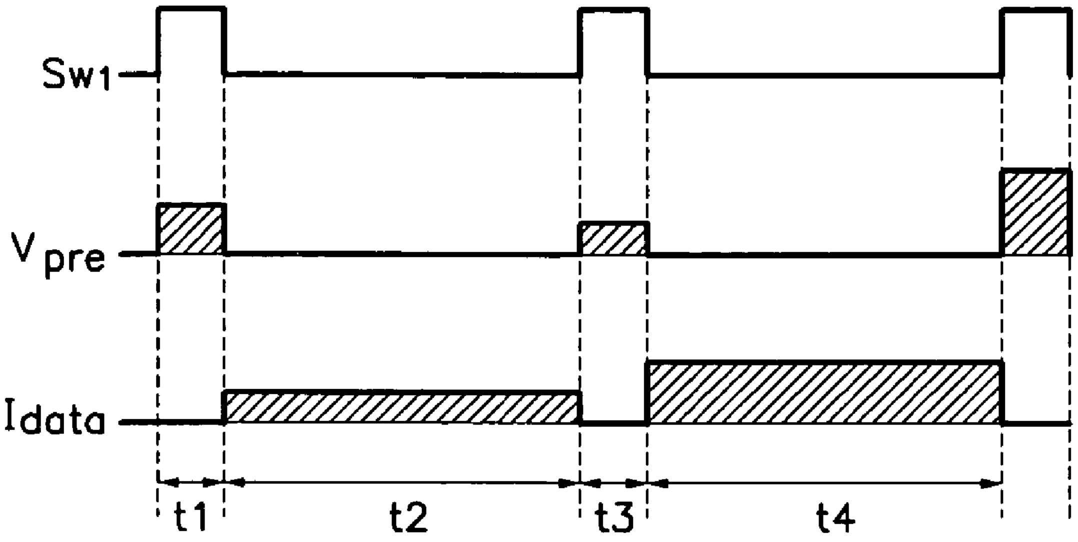
FIG. 7A shows a waveform diagram for illustrating the precharge voltage corresponding to the data current in the pixel circuit of FIG. 5A.

As can be seen in FIGS. 5A and 6A, when a high level control signal for precharge is applied to the switch SW1, the switch SW1 is turned on (i.e., closed), and a precharge voltage Vpre is applied to the data line Dm (see FIG. 7A, for example).

In this instance, the precharge voltage Vpre is established according to the data current to be applied to the data line Dm. The precharge voltage Vpre will be described in further detail later.

Next, the switch SW1 is turned off, a select signal applied to the scan line Sn becomes low level, and transistors M3 and M4 are turned on. Therefore, a transistor M1 is diode-connected, and a voltage corresponding to the data current from the data line Dm is charged in a capacitor C1. In this instance, since the data line Dm is charged with the precharge voltage Vpre, the voltage corresponding to the data current is quickly charged in the capacitor C1.

When programming of the data current is finished, the transistors M3 and M4 are turned off, and a transistor M2 is turned on in response to an emit signal applied from the scan line En. In this instance, the data current is supplied to the organic EL element OLED through the transistor M2, and the organic EL element emits light in correspondence to the current.

Since the data programming operation is performed after the voltage precharge, the voltage charge caused by the data current is quickly performed, and more accurate gray scales are represented.

The case of applying the concept according to the exemplary embodiment of the present invention to the specific pixel circuit has been described above. However, the scope of the present invention is not limited to the pixel circuit shown in FIG. 5A, and the concept according to the exemplary embodiment of the present invention is applicable to any suitable current programming type pixel circuits which have the data programming time as a critical problem.

In particular, the driving transistor M1 of FIG. 5A can be replaced by any suitable active element which includes a first electrode, a second electrode, and a third electrode, and controls the current which flows to the third electrode from the second electrode according to the voltage applied to the first electrode. Also, while the driving transistor M1 of FIG. 5A is realized with a P-type transistor, it can be realized with an N-type transistor in other embodiments. Further, the transistors M2, M3, and M4 for coupling two accessed terminals in response to the signals applied to gates can be realized with various types of suitable switches.

Figure 5B:
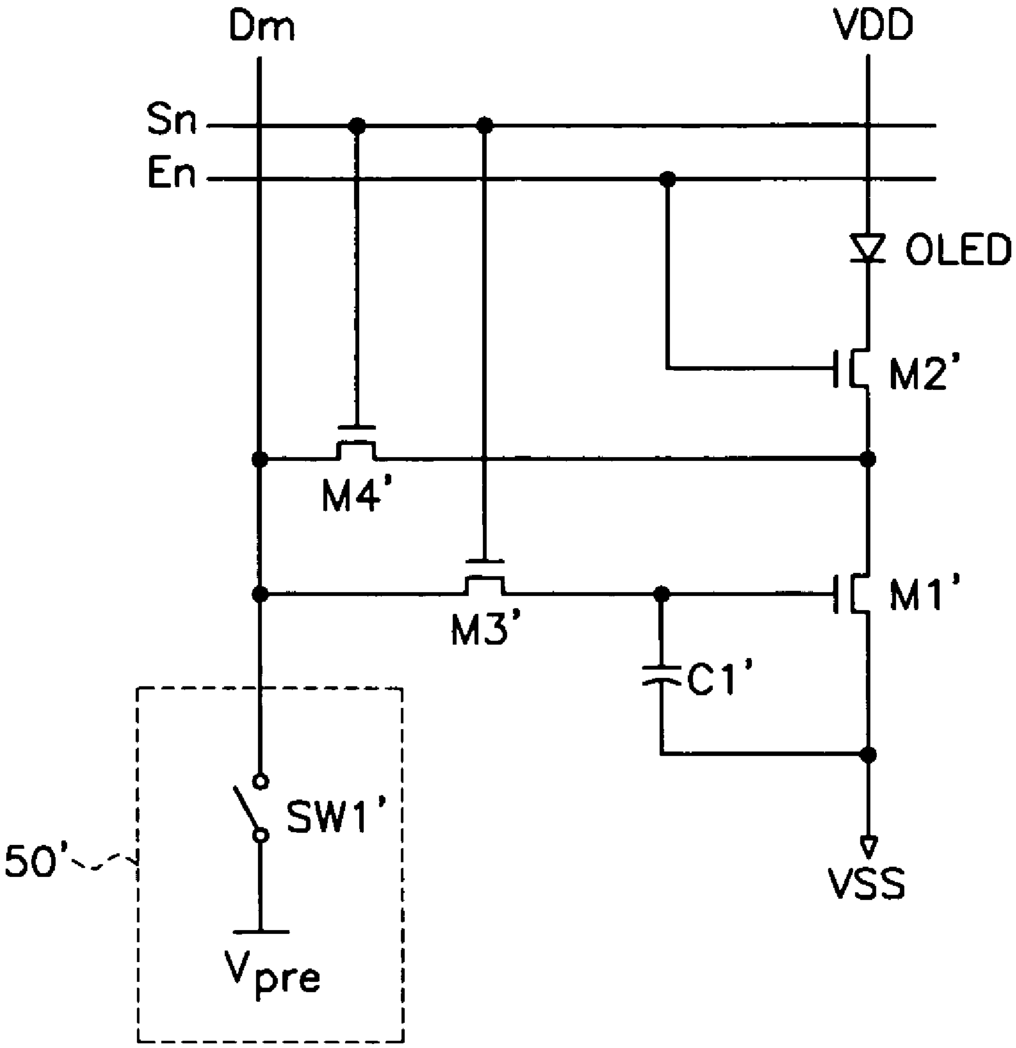
FIG. 5B shows application of a precharge voltage to a pixel circuit in another exemplary embodiment of the present invention.
Figure 6B:
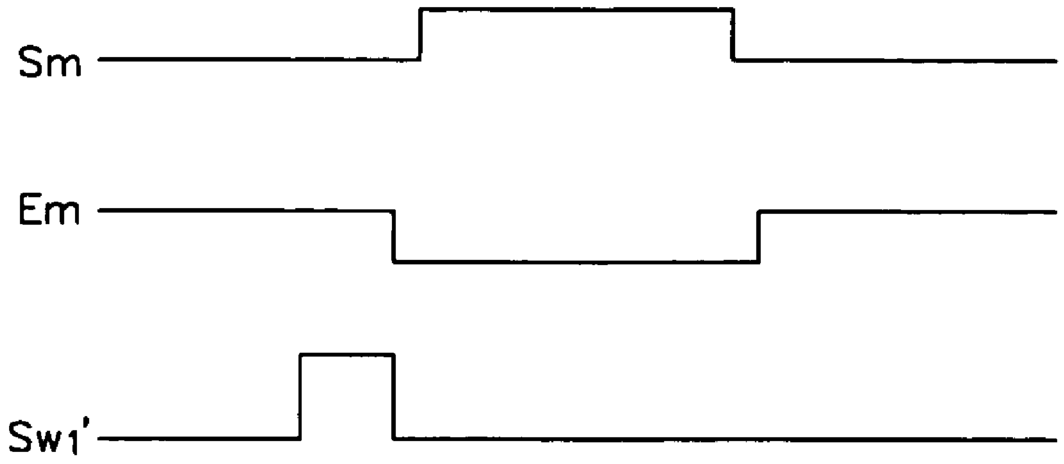
FIG. 6B shows a driving waveform diagram for driving the pixel circuit of FIG. 5B.

By way of example, FIG. 5B illustrates a pixel circuit in another exemplary embodiment of the present invention, which can be applied to the image display device of FIG. 4. The pixel circuit of FIG. 5B includes N-type transistors M1', M2', M3', M4' and a capacitor C1' that are interconnected together in substantially the same relationship as the transistors M1, M2, M3, M4 and the capacitor C1 of FIG. 5A. The precharge voltage Vpre in FIG. 5B is supplied by a precharge driver 50' including a switch SW1'. The organic EL element OLED is connected between the power source VDD and the transistor M2'. FIG. 6B shows a driving waveform diagram for the case of FIG. 5B where N-type transistors are used as transistors M2', M3' and M4'.

A method for establishing a precharge voltage according to the exemplary embodiment of the present invention will be described.

In the current programming pixel circuit, the data programming time becomes different according to the level of the voltage at the data line caused by the data current programmed to the pixel circuit coupled to a previous scan line which is selected before the corresponding scan line Sn.

When the driving transistor M1 is a P-type transistor as shown in FIG. 5A, a level of the voltage applied to the gate of the driving transistor M1 to allow a large amount of data current to flow to the organic EL element OLED is low, and a level of the voltage applied to the gate of the driving transistor M1 to allow only a small amount of data current to flow to the organic EL element OLED is high.

Therefore, the precharge driver 500 applies the precharge voltage Vpre which is inversely proportional to the data current to the data line Dm as shown in FIG. 7A, so that the data currents of all the gray levels may be programmed within a pixel select time.

However, when the driving transistor M1' is realized as an N-type transistor as shown in FIG. 5B, the voltage applied to the gate of the driving transistor M1' is proportional to the data current which flows to the organic EL element OLED.

Figure 7B:
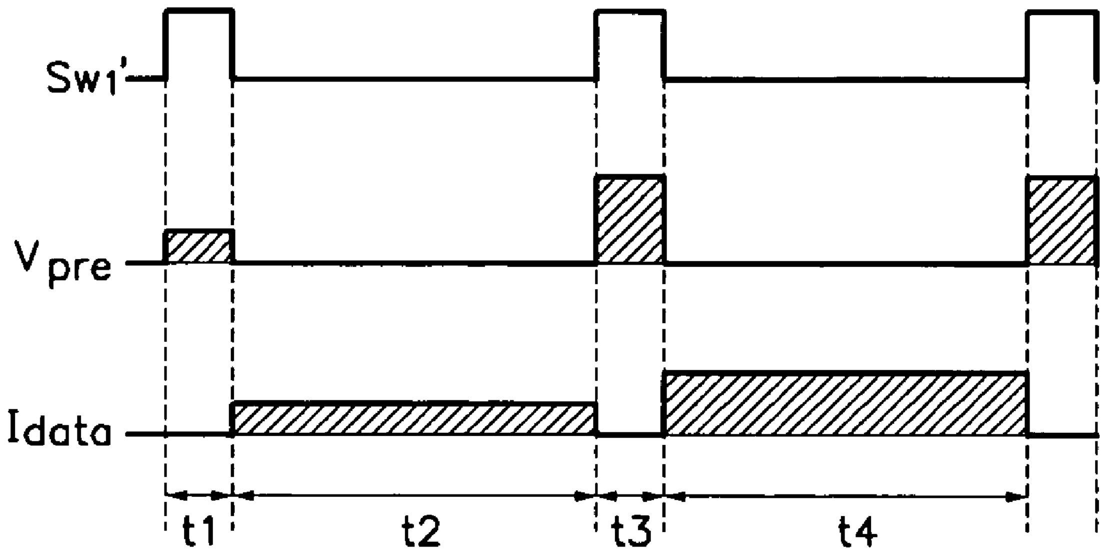
FIG. 7B shows a waveform diagram for illustrating the precharge voltage corresponding to the data current in the pixel circuit of FIG. 5B.

Therefore, the precharge driver 500 in this instance establishes the precharge voltage Vpre with a voltage which is proportional to the data current. Such proportional relationship between the data current and the precharge voltage, for example is illustrated in FIG. 7B.

Figure 8:
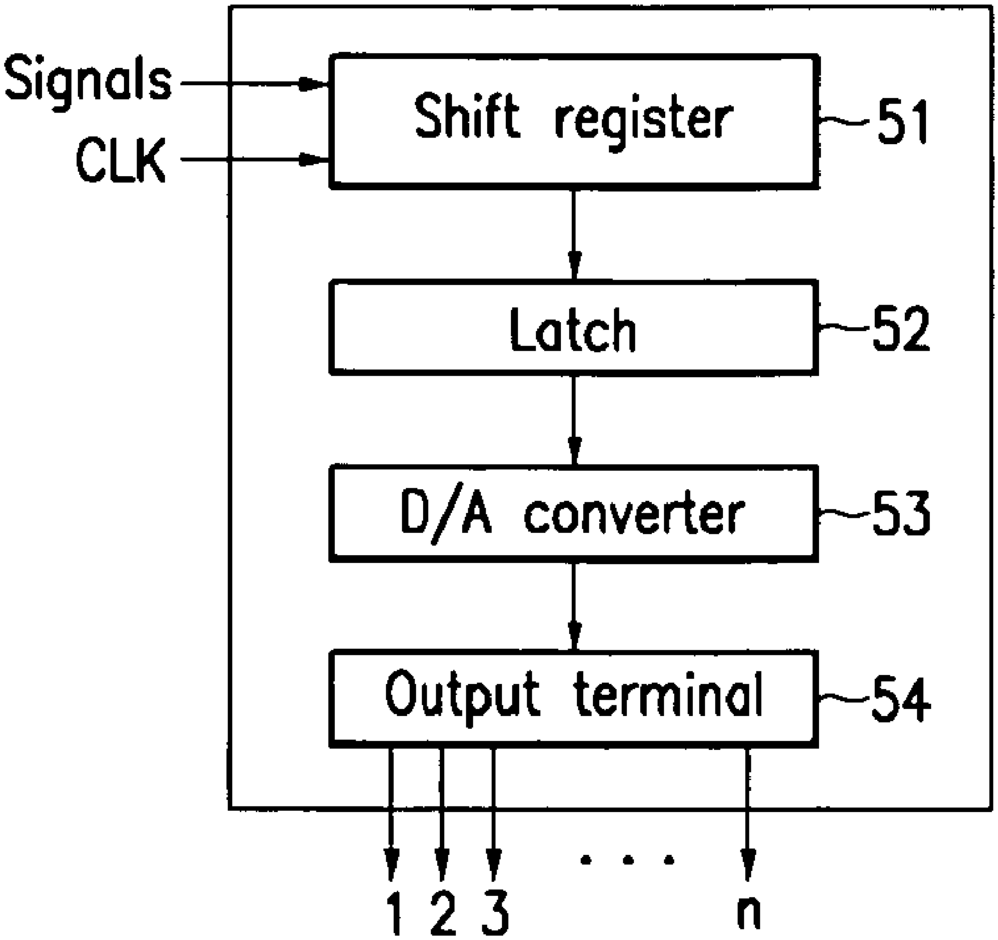
FIG. 8 shows a precharge voltage generator according to an exemplary embodiment of the present invention.

FIG. 8 shows a precharge voltage generator according to an exemplary embodiment of the present invention.

As shown, the precharge voltage generator includes a shift register 51, a latch 52, a D/A (digital/analog) converter 53, and an output terminal 54.

The shift register 51 sequentially outputs image signals to the latch according to input clock signals CLK.

The D/A converter 53 has a corresponding matrix between the image signals and analog voltages, and converts the image signals applied from the latch 53 into corresponding analog voltages. The output terminal 54 outputs the image signals as precharge voltages 1 . . . n.

Accordingly, the precharge voltages which are different based on the image signals can be applied to the pixel circuits, and as a result, the precharge voltage which is proportional/inversely proportional to the data current can be applied to the precharge driver 500.

FIG. 8 illustrates one example of the precharge voltage generators that can be used. The desired precharge voltage may be generated by using any other suitable device as those skilled in the art would recognize.

While this invention has been described in connection with certain exemplary embodiments, it is to be understood that the invention is not limited to the disclosed embodiments, but on the contrary, is intended to cover various modifications and equivalent arrangements included within the spirit and scope of the appended claims, and equivalents thereof.

For example, the precharge voltage does not need to be varied depending on all types of data currents, and may instead be varied according to the current included in a predetermined part of the data currents.

According to the exemplary embodiment, the data programming time is reduced by applying the precharge voltage to the current programming pixel circuit.

Also, the data lines are accurately precharged by using the precharge voltage caused by the data current, and the data current of all the gray levels are programmed within the pixel select time.

What is claimed is:

1. An image display device comprising:

a plurality of data lines for transmitting data currents which correspond to images;

a plurality of scan lines for transmitting select signals;

a plurality of pixel circuits, coupled to the data lines and the scan lines, for displaying the images which correspond to the data currents in response to the select signals; and a precharge driver for applying a precharge voltage to at least one of the data lines, wherein the precharge driver varies the precharge voltage in correspondence to at least one of the data currents.

2. The image display device of claim 1, wherein the precharge driver applies the precharge voltage to the at least one of the data lines before the at least one of the data currents is applied to the at least one of the data lines.

3. The image display device of claim 1, wherein the precharge driver applies the precharge voltage to one of the data lines coupled to a corresponding one of the pixel circuits before one of the select signals is applied to one of the scan lines coupled to the corresponding one of the pixel circuits after another one of the select signals is applied to a previous one of the scan lines.

4. The image display device of claim 1, wherein at least one of the pixel circuits comprises:

a display element for displaying the images corresponding to an amount of a current which is applied thereto;

a driving transistor including a first electrode, a second electrode, and a third electrode, the driving transistor controlling the current which flows to the third electrode from the second electrode according to a voltage difference between the first electrode and the second electrode;

a first switch for transmitting a corresponding one of the data currents applied to a corresponding one of the data lines to the first electrode of the driving transistor in response to a corresponding one of the select signals;

a second switch for diode-connecting the driving transistor in response to the corresponding one of the select signals; and a capacitor, coupled between the first electrode and the second electrode of the driving transistor, for storing a voltage corresponding to the corresponding one of the data currents.

5. The image display device of claim 4, wherein the driving transistor is a P-type transistor, and the precharge voltage is inversely proportional to a magnitude of the corresponding one of the data currents.

6. The image display device of claim 4, wherein the driving transistor is an N-type transistor, and the precharge voltage is proportional to a magnitude of the corresponding one of the data currents.

7. The image display device of claim 4, wherein the first switch and the second switch are the same type of transistors as the driving transistor.

8. The image display device of claim 1, wherein the precharge driver comprises a precharge voltage source, and a switch coupled between the precharge voltage source and a corresponding one of the data lines.

9. The image display device of claim 8, wherein the precharge voltage source comprises:

a shift register for sequentially shifting data which correspond to the images;

a latch for storing the data transmitted by the shift register; and a D/A (digital/analog) converter for converting the data stored in the latch into analog voltages that are provided as the precharge voltage.

10. An image display device including a plurality of scan lines and a plurality of data lines, and a plurality of pixel circuits, coupled to the scan lines and the data lines, for displaying images according to data currents applied to the data lines in response to select signals applied to the scan lines, comprising:

a data driver for applying the data currents corresponding to the images to the data lines;

a scan driver for supplying the select signals to the scan lines; and a precharge driver for applying the precharge voltage corresponding to image signals for the images to the data lines.

11. The image display device of claim 10, wherein the precharge driver applies the precharge voltage to at least one of the data lines before a corresponding at least one of the data currents is applied to the at least one of the data lines.

12. The image display device of claim 10, wherein the precharge driver comprises:

a shift register for sequentially shifting the image signals, and storing them;

a latch for storing the image signals transmitted by the shift register; and a D/A (digital/analog) converter for converting the image signals stored in the latch into analog voltages that are provided as the precharge voltage.

13. A driving method of an image display device including a plurality of data lines for transmitting data currents corresponding to images, a plurality of scan lines for transmitting select signals, and a plurality of pixel circuits coupled to the data lines and the scan lines, comprising:

applying a precharge voltage to one of the data lines during a first period; and transmitting one of the data currents provided by one of the data lines to a corresponding one the pixel circuits in response to one the select signals provided by a corresponding one of the scan lines during a second period, wherein the precharge voltage has different levels with respect to at least two of the data lines for applying different said data currents.

14. The driving method of claim 13, wherein each said pixel circuit comprises:

a display element for displaying the images corresponding to an amount of a current which is applied thereto;

a driving transistor including a first electrode, a second electrode, and a third electrode, the driving transistor controlling a current which flows to the third electrode from the second electrode according to a voltage difference between the first electrode and the second electrode;

a first switch for transmitting a corresponding one of the data currents applied to a corresponding one of the data lines to the first electrode of the driving transistor in response to a corresponding one of the select signals;

a second switch for diode-connecting the driving transistor in response to the corresponding one of the select signals; and a capacitor, coupled between the first electrode and the second electrode of the driving transistor, for storing a voltage corresponding to the corresponding one of the data currents.

15. The driving method of claim 14, wherein the driving transistor is a P-type transistor, and the precharge voltage applied to the corresponding one of the data lines is inversely proportional to a corresponding one of the data currents.

16. The driving method of claim 14, wherein the driving transistor is an N-type transistor, and the precharge voltage applied to the corresponding one of the data lines is proportional to a corresponding one of the data currents.

17. An image display device comprising:

a plurality of data lines for transmitting data currents which correspond to images;

a plurality of first scan lines for transmitting first select signals;

a plurality of second scan lines for transmitting second select signals;

a plurality of pixel circuits, each said pixel circuit being coupled to a corresponding said data line, a corresponding said first scan line and a corresponding said second scan line, for displaying the images which correspond to the data currents in response to the first and second select signals; and a precharge driver for applying a precharge voltage to the data lines, wherein the precharge driver varies the precharge voltage in correspondence to the data currents.

18. The image display device of claim 17, further comprising a first scan driver for providing the first select signals and a second scan driver for providing the second select signals.

19. The image display device of claim 17, wherein for each said pixel circuit, the precharge voltage is applied prior to applying a corresponding said data current.

20. The image display device of claim 17, wherein each said pixel circuit receives a corresponding said first select signal to store a voltage corresponding to a corresponding said data current thereon before receiving a corresponding said second select signal to emit light corresponding to the voltage.

* * * * *